United States Patent
Hannon et al.

(10) Patent No.: US 8,242,030 B2
(45) Date of Patent: Aug. 14, 2012

(54) ACTIVATION OF GRAPHENE BUFFER LAYERS ON SILICON CARBIDE BY ULTRA LOW TEMPERATURE OXIDATION

(75) Inventors: James B. Hannon, Yorktown Heights, NY (US); Fenton R. McFeely, Yorktown Heights, NY (US); Satoshi Oida, Yorktown Heights, NY (US); John J. Yurkas, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 12/566,870

(22) Filed: Sep. 25, 2009

(65) Prior Publication Data
US 2011/0073834 A1  Mar. 31, 2011

(51) Int. Cl.
*H01L 21/461* (2006.01)
*H01L 21/31* (2006.01)

(52) U.S. Cl. ........ 438/765; 438/767; 438/770; 438/931; 257/77

(58) Field of Classification Search .................. 438/765, 438/767, 770, 931; 257/77
See application file for complete search history.

(56) References Cited

U.S. PATENT DOCUMENTS

| | | | |
|---|---|---|---|
| 5,612,260 A | 3/1997 | Palmour | |
| 5,698,472 A | 12/1997 | Harris | |
| 5,759,908 A | 6/1998 | Steckl et al. | |
| 7,462,540 B2 | 12/2008 | Takahashi et al. | |
| 7,569,496 B2 | 8/2009 | Nakamura et al. | |
| 2009/0020764 A1 | 1/2009 | Anderson et al. | |
| 2009/0181502 A1 | 7/2009 | Parikh et al. | |
| 2009/0236609 A1 | 9/2009 | de Heer et al. | |
| 2010/0279426 A1* | 11/2010 | Tour et al. | 436/149 |
| 2011/0042649 A1* | 2/2011 | Duvall et al. | 257/27 |

OTHER PUBLICATIONS

Graphene, [online]; [retrieved on Sep. 16, 2009]; retrieved from the Internet http://en.wikipedia.org/wiki/Graphene.
P. Shemella et al; "Electronic structure and band-gap modulation of graphene via substrate surface chemistry;" Applied Physics Letters 94, 032101 (2009).
Max C. Lemme et al., "A Graphene Field-Effect Device," IEEE Electron Device Letters, vol. 28, No. 4, Apr. 2007.
S. Oida et al., "Decoupling Graphene From SiC(0001) Via Oxidation," Physical Review B (Condensed Matter and Materials Physics); American Physical Society by AIP USA; Rapid Communications; vol. 82, No. 4, 2010.
International Search Report; International Application No. PCT/EP2010/062723; International Filing Date: Aug. 31, 2010; Date of Mailing: Dec. 22, 2010.
International Search Report—Written Opinion ; International Application No. PCT/EP2010/062723; International Filing Date: Aug. 31, 2010; Date of Mailing: Dec. 22, 2010.

* cited by examiner

*Primary Examiner* — Phat X Cao
(74) *Attorney, Agent, or Firm* — Cantor Colburn LLP; Vazken Alexanian

(57) ABSTRACT

A method of electrically activating a structure having one or more graphene layers formed on a silicon carbide layer includes subjecting the structure to an oxidation process so as to form a silicon oxide layer disposed between the silicon carbide layer and a bottommost of the one or more graphene layers, thereby electrically activating the bottommost graphene layer.

19 Claims, 2 Drawing Sheets

ACTIVATION OF GRAPHENE BUFFER LAYERS ON SILICON CARBIDE BY ULTRA LOW TEMPERATURE OXIDATION

BACKGROUND

The present invention relates generally to semiconductor devices and, more particularly, to activation of graphene buffer layers on silicon carbide by ultra low temperature oxidation.

Graphene refers to a two-dimensional planar sheet of carbon atoms arranged in a hexagonal benzene-ring structure. A free-standing graphene structure is theoretically stable only in a two-dimensional space, which implies that a planar graphene structure does not exist in a free state, being unstable with respect to formation of curved structures such as soot, fullerenes, nanotubes or buckled two dimensional structures. Free standing graphene films have been made, but they may not have the idealized flat geometry. However, a two-dimensional graphene structure has been demonstrated on a surface of a three-dimensional structure, for example, on the surface of a silicon carbide (SiC) crystal.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi ($\pi$)-bond between the carbon atoms. Similar to the structure of benzene, the structure of graphene has a conjugated ring of the p-orbitals which exhibits a stabilization that is stronger than would be expected by the stabilization of conjugation alone, i.e., the graphene structure is aromatic. Unlike other allotropes of carbon such as diamond, amorphous carbon, carbon nanofoam, or fullerenes, graphene is not an allotrope of carbon since the thickness of graphene is one atomic carbon layer i.e., a sheet of graphene does not form a three dimensional crystal. However, multiple sheets of graphene may be stacked. A typical graphene "layer" may comprise a single sheet or multiple sheets of graphene, for example, between 1 sheet and 10 sheets.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions having an effective mass of zero and moving at the effective speed of light of $c_{eff} \approx 10^7$ m/sec. Their relativistic quantum mechanical behavior is governed by Dirac's equation. As a consequence, graphene sheets may have a large carrier mobility of greater than 60,000 cm$^2$/V-sec at 4K. At 300K, the carrier mobility can be about 15,000 cm$^2$/V-sec. Also, quantum Hall effect has been observed in graphene sheets.

A perfect graphene structure consists exclusively of hexagonal cells. Any pentagonal or heptagonal cell constitutes a structural defect. It should be noted that a large number of ordered defects in the graphene structure convert a graphene layer into other carbon-based structures such as a large fullerenes and nanotubes, etc. In particular, carbon nanotubes may be considered as graphene sheets rolled up into nanometer-sized cylinders due to the presence of defects. A fullerene, also known as a "buckyball" having a pattern similar to the pattern on a soccer ball, would be formed if some hexagons are substituted with pentagons. Likewise, insertion of an isolated heptagon causes the sheet to become saddle-shaped. Controlled addition of pentagons and heptagons would allow a wide variety of shapes to be formed.

Graphene layers may be grown by solid state graphitization, i.e., by sublimating silicon atoms from a surface of a silicon carbide crystal, such as the (0001) surface. At about 1,150° C., a complex pattern of surface reconstruction begins to appear at an initial stage of graphitization. Typically, a higher temperature is needed to form a graphene layer. Graphene layer on another material is known in the art. For example, single or several layers of graphene may be formed on a silicon carbide (SiC) substrate by sublimation decomposition of a surface layer of a silicon carbide material.

Graphene displays many other advantageous electrical properties such as electronic coherence at near room temperature and quantum interference effects. Ballistic transport properties in small scale structures are also expected in graphene layers.

SUMMARY

In an exemplary embodiment, a method of electrically activating a structure having one or more graphene layers formed on a silicon carbide layer includes subjecting the structure to an oxidation process so as to form a silicon oxide layer disposed between the silicon carbide layer and a bottommost of the one or more graphene layers, thereby electrically activating the bottommost graphene layer.

In another embodiment, a method of forming a graphene-based electronic device includes forming one or more graphene layers on a silicon carbide layer, wherein a bottommost of the one or more graphene layers bonded to the silicon carbide layer initially comprises an electrically non-conductive buffer layer; and performing an oxidation process so as to form a silicon oxide layer disposed between the silicon carbide layer and the bottommost of the one or more graphene layers, thereby electrically activating the bottommost graphene layer.

In still another embodiment, a graphene-based electronic device includes one or more graphene layers formed over a silicon carbide layer; and a silicon oxide layer disposed between the silicon carbide layer and the one or more graphene layers such that bottommost of the one or more graphene layers is electrically active.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 2:
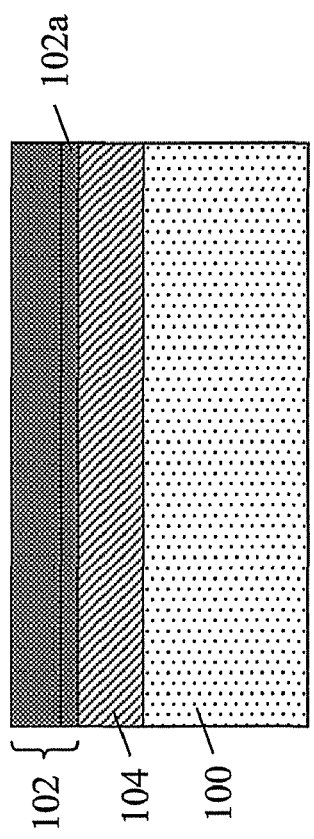
FIG. 2 is schematic diagram of the structure of FIG. 1 following an oxidation process to electrically activate a bottommost graphene layer, in accordance with an embodiment of the invention.

As indicated above, graphene (either one or a small number of layers of carbon in hexagonal $sp^2$ hybridized sheets), has unique electronic properties that have attracted great interest due to potential applications in nanoelectronics. Within the graphene family, single layer graphene exhibits significantly higher mobility than multilayer graphene and thus has the greatest potential for the fabrication of high speed devices.

The fabrication of wafer-scale structures from which electronic devices may be subsequently fabricated, and that are capable of exploiting the electronic properties inherent in monolayer graphene is a principal focus of the present invention embodiments.

Graphene may be grown by a variety of methods, e.g., exfoliation of samples from pyrolytic graphite, chemical vapor deposition (CVD), or silicon (Si) sublimation from SiC substrates. From the standpoint of compatibility with current device fabricating processes, Si sublimation from SiC (0001) and CVD onto SiC substrates both have one extremely appealing characteristic: wafer-sized samples may be grown directly on semi-insulating substrates. However, the growth of graphene on SiC, either by sublimation of Si or by carbon CVD, has a serious drawback. The first graphene layer is non-conductive. Thus from an electronic point of view, this layer is not graphene at all, but rather only a "buffer layer." Hereinafter, a non-conductive hexagonal carbon monolayer will be referred to as a buffer layer, or equivalently a graphene buffer layer, whereas any conductive layer comprising a hexagonal sheet or multilayer sheets of carbon that are conductive will be referred to as graphene, or, equivalently, as true graphene.

It is well established that the reason for the non-conductivity of the buffer layer is that the π-bands that would be exhibited by a free-standing graphene layer (and that are responsible for the conduction) are destroyed by excessively strong covalent bonding to the SiC substrate. It is not the case, however, that the interaction of a monolayer of graphene with any substrate necessarily destroys the π-bands necessary for conduction. Exfoliated monolayer graphene disposed on $SiO_2$ has only weak interaction with the substrate and exhibit excellent electrical properties. Thus, if it were possible to insert a thin layer of oxidized silicon between a SiC-grown graphene buffer layer and the underlying SiC, the excessive graphene-substrate interaction could be reduced, restoring the π-bands and enhancing the conductivity.

While seemingly counter intuitive to attempt to improve the conductivity of a structure by oxidation, the formation of a silicon oxide decoupling layer between the graphene and the SiC substrate has a fair amount of a priori thermodynamic and kinetic plausibility. The free energy of formation of $SiO_2$ is more negative than that of $CO_2$ by approximately 100 kcal/mole at 500K. Thus, if a buffer layer/SiC structure were oxidized under such conditions so as to achieve thermodynamic equilibrium, essentially all of the oxygen reacted would be in the form of $SiO_2$. Of course, this offers no guarantee the desired structure can be synthesized, since equilibrium is not achievable under practical oxidation conditions. In fact, the equilibrium products of SiC oxidation are undesirable, as graphitic carbon (presumably highly disordered) would be produced in equimolar amounts to the $SiO_2$. Instead, the ideal to be sought is a kinetic regime in which the graphene remains inert to the oxidant (e.g., $O_2$), the SiC is oxidized to produce sufficient silicon oxide, and any carbon liberated from the oxidation of SiC is oxidized and carried away. The additional possibility is noted, however, that for sufficiently mild oxidation conditions forming very thin layers of oxidized silicon, no carbon might be liberated from the SiC substrate at all. The inventors herein have determined that these conditions may be satisfied by employing extremely low temperatures for the oxidation (e.g., T<400° C.) at oxygen pressures above 1 torr. Under these conditions, the requisite silicon oxide decoupling layer can be formed without damaging the graphene buffer layer.

Accordingly, disclosed herein is a structure in which oxidized silicon is disposed between a layer of graphene, which may either be a single layer or multilayer of graphene and a substrate comprising silicon carbide. The oxidized silicon layer has the effect of rendering the bottommost layer of the graphene conductive. In the absence of the oxidized silicon layer, the bottommost layer would otherwise be in direct contact with the SiC, and would thus be only serve a buffer layer for reasons outlined above. Also disclosed herein is a method for forming this structure.

Figure 1:
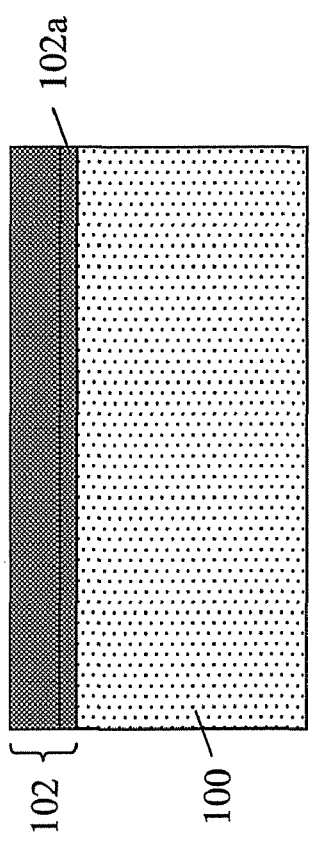
FIG. 1 is a schematic diagram of a silicon carbide substrate having one or more layers of graphene formed thereupon.

Referring to FIG. 1, there is shown a silicon carbide (SiC) substrate 100 having one or more layers of graphene 102 formed thereupon. Although the surface of the SiC substrate 100 and the graphene (buffer) layer(s) 102 formed thereon are depicted as planar layers for purposes of simplicity, it should be understood that the layers may have any geometric structure. Where multiple graphene layers 102 are formed on the SiC substrate, the bottommost of the graphene layers 102, as indicated above, comprises a graphene buffer layer 102a. Although the graphene layer(s) 102 may be formed on the SiC substrate 100 by any convenient method, particularly suitable methods include Si evaporation and CVD.

In an exemplary embodiment, the resulting structure of FIG. 1 is placed in a vacuum system with a base pressure of less than about $10^{-3}$ torr, and more preferably with a base pressure less than about $10^{-6}$ torr. The chamber is then evacuated to a pressure of less than about $10^{-3}$ torr, and more preferably less than about $10^{-6}$ torr. Oxygen gas is then introduced into the chamber at a pressure between about 1 torr and about 760 torr (1 atm). The sample is then heated to a temperature of less than about 450° C., more preferably between about 200° C. and about 400° C., and still more preferably about 250° C. and below, for times ranging from about 5 seconds to about 1 hour. More exact times and pressures employed would depend on specific the thickness of the graphene layer(s) 102. The sample may then be cooled to room temperature and removed from the vacuum system. It is noted that if it is desired to use 760 torr (1 atm) for the oxidation, an atmospheric pressure oxidation furnace could be used instead of the vacuum system. The operation of such a furnace for this process would be well known to one skilled the art.

The resulting structure of the above described oxidation process is illustrated in FIG. 2. As is shown, a decoupling oxide layer 104 is formed between the substrate 100 and the graphene layer(s) 102. At this point the graphene layer 102 is comprised entirely of conductive graphene (including the bottommost layer 102a), with the bottommost layer 102a no longer serving as buffer layer at the ⅔ interface.

EXAMPLE

To demonstrate the efficacy of the present invention embodiments, an epitaxial buffer layer on a SiC (0001) (Si face) was grown in an ultra-high vacuum system equipped with low-energy electron microscopy (LEEM). The graphene buffer layer was formed by Si evaporation. A buffer layer only structure was grown for the purpose of demonstration of efficacy, as this gives the most clear-cut and dramatic illustration of the efficacy of the method. However, as indicated above, the method may also be used in conjunction with multilayer graphene overlayers. LEEM analysis was used to locate a region on the substrate consisting of buffer layer only. A focused ion beam was then used to etch alignment marks onto the sample so that devices could then be formed on this buffer layer only region.

Titanium/palladium (Ti/Pd) electrodes were then fabricated on the specific buffer layer only area analyzed in LEEM, using the FIB fiducial marks to ensure proper alignment. The conductance of the buffer layer between the electrodes was then measured. The electrode separation was kept small (on the order of about a few hundred nanometers) in order to increase the probability of contacting individual buffer layer graphene domains, and to avoid passing current through the boundaries between domains. Even for relatively high bias voltages (e.g., 5 V) the current was extremely small, on the order of a few picoamperes (pA). From a conductivity point of view, this is essentially indistinguishable from a sample with no graphene present whatsoever.

Figure 3:
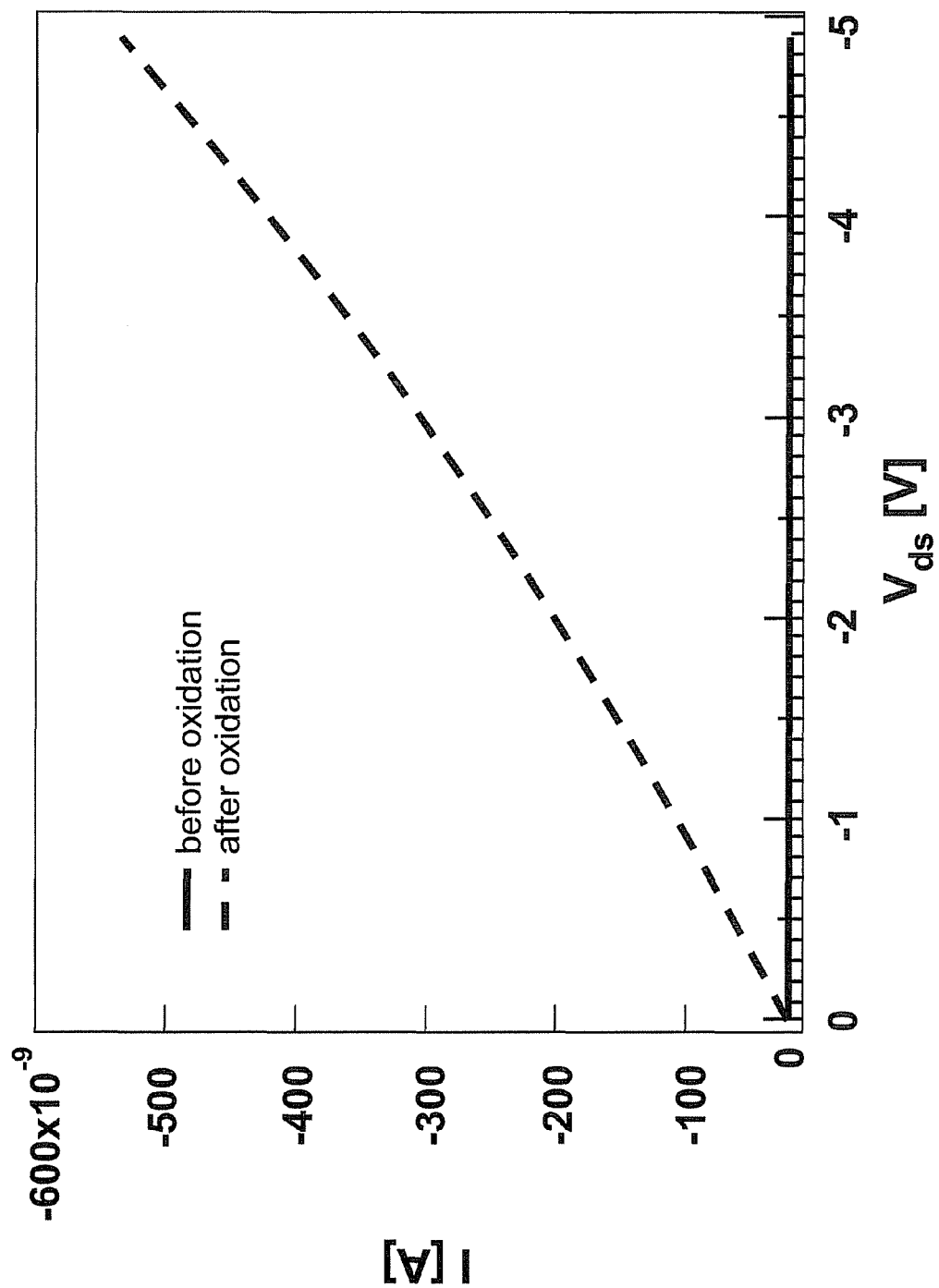
FIG. 3 is a graph of current versus voltage curves for an exemplary device before and after oxidation to decouple the graphene buffer layer from the silicon carbide layer and electrically activate the graphene layer.

The substrate was then oxidized as described above, at an oxygen pressure of 30 torr, and with a substrate temperature of 250° C., for 30 sec, with the electrodes in place. The conductance was then re-measured. For all of the buffer layer devices measured, the conductance increased by at least a factor of $10^4$. Current/voltage curves for an exemplary device before and after oxidation are illustrated in the graph FIG. 3. It should be noted that the "before oxidation" curve is slightly offset from zero to render it distinguishable from the voltage axis. To confirm that the conductance increase was due to oxidation, a control experiment was performed in which a buffer layer sample was treated exactly the same way as described above, except that the heating to 250° C. was carried out in vacuum rather than in a background pressure of oxygen. No conductance change was observed after such heating in vacuum.

In summary, graphene (monolayer and near-monolayer graphite) is a promising material for future transistor applications, owing to its extremely high electron mobility. However, it is difficult to grow graphene with requisite crystalline perfection. One of the more promising growth methods involves thermal decomposition of SiC to form a graphene layer atop the SiC. Up to one monolayer, graphene layers with very large domain sizes and a high degree of crystallographic perfection may be grown. Conversely, when proceeding beyond a single monolayer, random nucleation effects substantially degrade the perfection of the subsequently grown material. Unfortunately, while monolayer graphene could be useful for device applications, the monolayer of hexagonal graphite structure carbon produced atop SiC is not, because the chemical bonding interactions between it and the underlying SiC are too strong, disrupting the electronic structure of the monolayer and rendering it electrically inactive (nonconducting). Accordingly, the above described embodiments are directed to forming a layer of silicon oxide between the graphene monolayer and the underlying SiC, as monolayer graphene disposed on $SiO_2$ is electrically active and thus useful for device applications.

The inventive techniques described herein are based on at least the following considerations. First, it is thermodynamically much more favorable, (by 80 kcal/mole or more) to oxidize Si to $SiO_2$ than to oxidize C to $CO_2$. Thus, the equilibrium result of oxidizing SiC in the presence of excess C, in the form of a graphene monolayer, should be a state in which essentially all of the oxygen has gone to produce $SiO_2$ and no $CO_2$ would be produced. Second, graphene is kinetically very stable towards oxidizing atmospheres, much more so than Si. A regime can thus be established in which SiC beneath the graphene monolayer is oxidized, thereby disrupting the bonding between the graphene and the SiC so as to form a silicon oxide buffer layer between the two. It should also be pointed out that the more general term "silicon oxide" (as opposed to $SiO_2$) is used in this context, as it may not even be necessary to form fully stoichiometric $SiO_2$. That is, a mere monolayer of Si—O bonds could well suffice.

Due to the nature out-of-equilibrium conditions, and considering that the oxidation of the graphene is essentially irreversible, conditions under which (1) the graphene remains kinetically inert to the oxygen which comprises the oxidizing atmosphere, yet where (2) the underlying SiC can still be oxidized to a significant degree have been determined in the present invention embodiments. That is, by utilizing the regime of high oxygen pressure (about 0.1-760 torr) and relatively low temperature (below 450° C.), oxidations of graphene/SiC structures have been performed as described above. The treated structures were subjected to in situ X-ray photoelectron spectroscopy (XPS) analysis. The XPS analysis shows unambiguously that an oxidized layer may be formed underneath the graphene, without disrupting the graphene layer to any detectable extent. Ex situ atomic force microscope (AFM) measurements further confirm that the integrity of the graphene layer has been maintained.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of electrically activating a structure having one or more graphene layers formed on a silicon carbide layer, the method comprising:
    subjecting the structure to an oxidation process so as to form a silicon oxide layer disposed between the silicon carbide layer and a bottommost of the one or more graphene layers, thereby electrically activating the bottommost graphene layer.

2. The method of claim 1, further comprising performing the oxidation process in a chamber initially evacuated to a base pressure of about $10^{-3}$ torr or less.

3. The method of claim 1, further comprising performing the oxidation process in an atmospheric pressure oxidation furnace.

4. The method of claim 2, further comprising performing the oxidation process by introducing oxygen gas into the chamber at pressure between about 1 torr and about 760 torr.

5. The method of claim 4, further comprising performing the oxidation process by heating the structure to a temperature of less than about 450° C.

6. The method of claim 5, wherein the chamber is initially evacuated to a base pressure of less than about $10^{-6}$ torr.

7. The method of claim 5, wherein the structure is heated to a temperature between about 200° C. and about 400° C.

8. The method of claim 5, wherein the structure is heated to a temperature of about 250° C. or less.

9. The method of claim 5, wherein the structure is heated for a duration from about 5 seconds to about 1 hour.

10. A method of forming a graphene-based electronic device, the method comprising:
    forming one or more graphene layers on a silicon carbide layer, wherein a bottommost of the one or more graphene layers bonded to the silicon carbide layer initially comprises an electrically non-conductive buffer layer; and
    performing an oxidation process so as to form a silicon oxide layer disposed between the silicon carbide layer and the bottommost of the one or more graphene layers, thereby electrically activating the bottommost graphene layer.

11. The method of claim 10, further comprising performing the oxidation process in a chamber initially evacuated to a base pressure of about $10^{-3}$ torr or less.

12. The method of claim 10, further comprising performing the oxidation process in an atmospheric pressure oxidation furnace.

13. The method of claim 11, further comprising performing the oxidation process by introducing oxygen gas into the chamber at pressure between about 1 torr and about 760 torr.

14. The method of claim 13, further comprising performing the oxidation process by heating to a temperature of less than about 450° C.

15. The method of claim 14, wherein the chamber is initially evacuated to a base pressure of less than about $10^{-6}$ torr.

16. The method of claim 14, further comprising performing the oxidation process by heating to a temperature between about 200° C. and about 400° C.

17. The method of claim 14, further comprising performing the oxidation process by heating to a temperature of about 250° C. or less.

18. The method of claim 14, wherein the heating is performed for a duration from about 5 seconds to about 1 hour.

19. The method of claim 10, wherein the silicon oxide layer comprises silicon dioxide.

* * * * *